(12) United States Patent
Zeng et al.

(10) Patent No.: US 10,870,353 B2
(45) Date of Patent: Dec. 22, 2020

(54) HIGH-VOLTAGE INTERLOCK SYSTEM AND DETECTION METHOD THEREOF

(71) Applicant: Contemporary Amperex Technology Co., Limited, Ningde (CN)

(72) Inventors: Yuqun Zeng, Ningde (CN); Kai Wu, Ningde (CN); Wei Dai, Ningde (CN); Chao Wang, Ningde (CN); Qiandeng Li, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 134 days.

(21) Appl. No.: 16/357,558

(22) Filed: Mar. 19, 2019

(65) Prior Publication Data

US 2020/0094682 A1  Mar. 26, 2020

(30) Foreign Application Priority Data

Sep. 21, 2018 (CN) .......................... 2018 1 1109687

(51) Int. Cl.
| | |
|---|---|
| *B60L 3/04* | (2006.01) |
| *B60L 3/00* | (2019.01) |
| *H03K 17/687* | (2006.01) |

(52) U.S. Cl.
CPC .............. *B60L 3/04* (2013.01); *B60L 3/0069* (2013.01); *B60L 3/0092* (2013.01); *H03K 17/687* (2013.01)

(58) Field of Classification Search
CPC ........... B60L 3/04; B60L 3/0023–0092; H03K 17/687; G01R 31/05; G01R 31/005;
(Continued)

(56) References Cited

U.S. PATENT DOCUMENTS 3,297,954 A    1/1967  Wiley
4,351,405 A *  9/1982  Fields ................. B60L 15/2009
                                                180/65.225
(Continued)

FOREIGN PATENT DOCUMENTS

CN        101943736 A    1/2011
CN        104377684 A    2/2015
(Continued)

OTHER PUBLICATIONS

The partial European search report for European Application No. 19160898.3, dated Oct. 30, 2019, 20 pages.
(Continued)

*Primary Examiner* — Thienvu V Tran
*Assistant Examiner* — Nusrat Quddus
(74) *Attorney, Agent, or Firm* — Law Offices of Liaoteng Wang

(57) ABSTRACT

The present disclosure provides a high-voltage interlock system and a detection method thereof. The high-voltage interlock system includes a target control device and at least one non-target control device connected in sequence. The target control device includes a detection unit, a current generation controller, a current generator, and a second high-voltage component. A controller in the target control device generates a pulse drive signal for driving the current generation controller, receives a detection result signal output from a current detector, and determines a fault of a high-voltage interlock circuit according to the detection result signal; the current generation controller generates an alternating voltage signal according to the pulse drive signal; the current generator outputs an alternating current signal according to the alternating voltage signal; the current detector acquires a voltage signal across a detection resistor set and outputs the detection result signal.

16 Claims, 8 Drawing Sheets

(58) Field of Classification Search
CPC .... G01R 31/006; G01R 31/50; G01R 31/025; G01R 31/026; G01R 31/08; G01R 31/083; G01R 31/086; G01R 31/088; G01R 31/085; G01R 31/2829; G01R 31/14; G01R 27/18; H02M 1/00; H02H 3/28; H02H 3/003; H02H 3/027; H02H 3/044; H02H 3/26; H02H 3/305; H02H 3/32; H02H 3/337; H02H 3/36; H02H 3/38; H02H 3/42; H02H 3/17; H02H 1/043; H02H 1/063; H02H 1/003; H02H 7/0844; H02H 7/20; H02H 7/263; H02H 9/002; H02H 9/02; H02H 9/021; H02H 9/023; H02H 9/025; H02H 9/08
See application file for complete search history.

(56) References Cited

U.S. PATENT DOCUMENTS

| | | | | |
|---|---|---|---|---|
| 6,131,057 | A * | 10/2000 | Tamaki | B60L 3/0061 701/22 |
| 7,030,623 | B1 | 4/2006 | Carpenter | |
| 8,571,738 | B1 * | 10/2013 | Potter | B60L 3/0046 701/22 |
| 10,446,814 | B2 * | 10/2019 | Gross | H02J 7/0021 |
| 2002/0017405 | A1 * | 2/2002 | Nada | B60L 3/0069 180/65.235 |
| 2003/0165072 | A1 | 9/2003 | Nadd et al. | |
| 2007/0291425 | A1 * | 12/2007 | Yugou | B60L 3/0046 361/23 |
| 2010/0187904 | A1 * | 7/2010 | Lucas | B60K 6/40 307/10.1 |
| 2010/0213884 | A1 * | 8/2010 | Xiang | H02P 6/34 318/400.36 |
| 2011/0024255 | A1 * | 2/2011 | Gomm | B60K 6/387 192/84.1 |
| 2011/0062798 | A1 * | 3/2011 | Tarchinski | B60L 3/00 307/328 |
| 2011/0172839 | A1 * | 7/2011 | Brown | B60L 11/1809 700/292 |
| 2011/0174561 | A1 * | 7/2011 | Bowman | B60L 50/64 180/65.245 |
| 2013/0003237 | A1 * | 1/2013 | Casey | B60L 3/12 361/62 |
| 2013/0106171 | A1 * | 5/2013 | Ferrel | B60L 3/0061 307/9.1 |
| 2013/0270974 | A1 | 10/2013 | Wang et al. | |
| 2014/0176028 | A1 * | 6/2014 | Tobari | H02P 21/18 318/400.02 |
| 2014/0211345 | A1 * | 7/2014 | Thompson | B60L 53/305 361/42 |
| 2016/0146876 | A1 * | 5/2016 | Park | G01R 31/50 701/29.2 |
| 2016/0261127 | A1 * | 9/2016 | Worry | H02J 7/0026 |
| 2017/0292982 | A1 | 10/2017 | Acena et al. | |
| 2018/0105125 | A1 * | 4/2018 | Gabriel | B60R 16/0232 |
| 2018/0196105 | A1 | 7/2018 | Inukai et al. | |
| 2019/0128948 | A1 * | 5/2019 | Smith | B60L 3/0092 |
| 2020/0094682 | A1 * | 3/2020 | Zeng | G01R 31/52 |

FOREIGN PATENT DOCUMENTS

| | | |
|---|---|---|
| CN | 105313700 A | 2/2016 |
| CN | 106885967 A | 6/2017 |
| CN | 107255782 A | 10/2017 |
| CN | 107291000 A | 10/2017 |
| CN | 108387809 A | 8/2018 |
| DE | 102010048348 A1 | 5/2011 |
| WO | WO2015024946 A1 | 2/2015 |

OTHER PUBLICATIONS

N.A. N.A.: "75-V/10-A Protected Full-Bridge Power Stage Reference Design for Brushed DC Motors", TI Designs, Mar. 1, 2017, pp. 1-44, XP055634277.

Andreas Tantos: "Safety Features", Modular Circuits, Feb. 11, 2018, pp. 1-16, XP055634281.

The first Office Action together with the search report for Chinese Application No. 201811109687.7, dated Nov. 13, 2019, 5 pages.

The extended European search report for European Application No. 19160898.3, dated Mar. 27, 2020, 19 pages.

Minh-Khai Nguyen et al: "Single-Phase AC-AC Converter Based on Quasi-Z-Source Topology", Aug. 1, 2010, pp. 2200-2210, XP011302545.

Chen et al: "Novel Current Mode AC/AC Converters with High Frequency AC Link", Jan. 1, 2005, pp. 39-44, XP031000156.

* cited by examiner

HIGH-VOLTAGE INTERLOCK SYSTEM AND DETECTION METHOD THEREOF

CROSS-REFERENCE TO RELATED APPLICATION

This application is based upon and claims priority to Chinese Patent Application No. 201811109687.7, filed on Sep. 21, 2018, the content of which is incorporated herein by reference in its entirety.

FIELD

The present disclosure relates to the field of power technology, and more particularly to a high-voltage interlock system and a detection method thereof.

BACKGROUND

With the rapid development of new energy vehicles, the safety of new energy vehicles has become a major concern. Power supply of the new energy vehicles rely on a high voltage and a high current. Therefore, a high-voltage interlock system is very important in a high-voltage circuit monitoring system to ensure the safety under high voltages.

The high-voltage interlock system is used to monitor the integrity of the connection between various high-voltage components in a new energy vehicle in real time, so as to ensure that the new energy vehicle can operate in a safe state. At present, the high-voltage interlock system may be subject to external interference, such as electrostatic interference, and a detection signal may fluctuate, resulting in a false alarm from the high-voltage interlock system, which reduces the accuracy of determining faults of the high-voltage interlock system.

SUMMARY

The embodiments of the present disclosure provide a high-voltage interlock system and a detection method thereof.

In a first aspect, the embodiments of the present disclosure provide a high-voltage interlock system including a target control device and at least one non-target control device connected in sequence. The non-target control device includes a detection unit and a first high-voltage component; the detection unit includes a controller, a current detector, and a detection resistor set; the controller is connected to the current detector, and configured to receive a detection result signal output by the current detector and determine a fault of a high-voltage interlock circuit according to the detection result signal; the current detector is connected to the detection resistor set, and configured to acquire a voltage signal across the detection resistor set and output the detection result signal according to the voltage signal; and the first high-voltage component is connected to the detection unit. The target control device includes a detection unit, a current generation controller, a current generator, and a second high-voltage component; a controller in the target control device is connected to the current generation controller, and configured to generate a pulse drive signal for driving the current generation controller; the current generation controller is connected to the current generator, and configured to generate an alternating voltage signal according to the pulse drive signal; the current generator is connected to a detection resistor set in the target control device, and configured to output an alternating current signal according to the alternating voltage signal; and the second high-voltage component is connected to the current generator and the detection resistor set in the target control device. The current generator, the second high-voltage component, the detection resistor set in the target control device together with the detection resistor set and the first high-voltage component in the at least one non-target control device form the high-voltage interlock circuit in which the alternating current signal is transmitted.

In a second aspect, the embodiments of the present disclosure provide a detection method for the high-voltage interlock system. The detection method is applied in the above high-voltage interlock system and includes: the controller in the target control device generating the pulse drive signal; the current generation controller in the target control device generating the alternating voltage signal based on the pulse drive signal; the current generator in the target control device outputting the alternating current signal to the high-voltage interlock circuit according to the alternating voltage signal; the current detector in the target control device acquiring the voltage signal across the detection resistor set, and outputting the detection result signal according to the voltage signal; and the controller in the target control device receiving the detection result signal output by the current detector, and determining the fault of the high-voltage interlock circuit based on the detection result signal.

BRIEF DESCRIPTION OF THE DRAWINGS

The present disclosure may be better understood from the following description of specific embodiments of the present disclosure in conjunction with the accompanying drawings, wherein same or similar reference numerals represent same or similar features.

DETAILED DESCRIPTION

The features and exemplary embodiments of various aspects of the present disclosure will be described in detail below. In the following detailed description, numerous specific details are set forth in order to provide a thorough understanding of the present disclosure. However, it will be apparent to those skilled in the art that the present disclosure may be practiced without some of these specific details. The following description of the embodiments is merely intended to provide a better understanding of the present disclosure by illustrating examples of the present disclosure. The present disclosure is by no means limited to any specific configuration and algorithm provided blow, but covering any modification, substitution and improvement of elements, components and algorithm without departing from the spirit of the present disclosure. In the accompanying drawings and the following description, well-known structures and techniques are not illustrated as so to avoid unnecessarily obscuring the present disclosure.

Embodiments of the present disclosure provide a high-voltage interlock system and a detection method thereof, which can be applied to a scenario of high-voltage interlock security protection in a new energy vehicle. The high-voltage interlock system in the embodiments of the present disclosure is a high-voltage interlock system of an alternating current type, and an alternating current signal is transmitted in a high-voltage interlock circuit in the high-voltage interlock system. With the high-voltage interlock system and the detection method thereof in the embodiments of the present disclosure, the fault misjudgment caused by the high-voltage interlocking system due to the external interference can be reduced or even avoided, thereby improving the accuracy of determining faults by the high-voltage interlock system.

Figure 1:
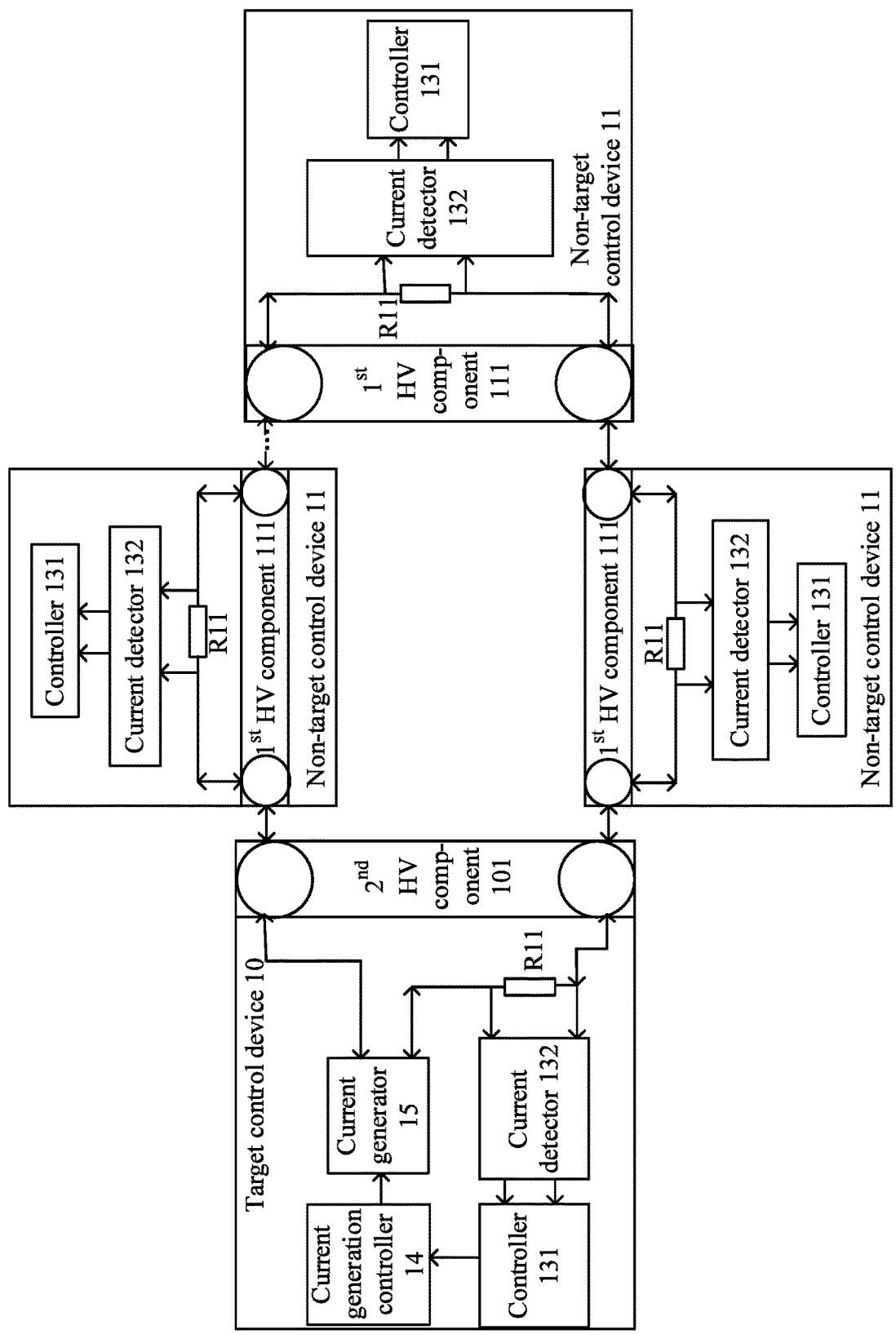
FIG. 1 is a schematic structural diagram of a high-voltage interlock system according to an embodiment of the present disclosure.

FIG. 1 is a schematic structural diagram of a high-voltage ("HV") interlock system according to an embodiment of the present disclosure. As shown in FIG. 1, the high-voltage interlock system includes a target control device 10 and at least one non-target control device 11 that are sequentially connected. In some examples, the target control device 10 and the non-target control device 11 may be any of vehicle control systems. The vehicle control system may include a battery management system (BMS), a vehicle controller, a motor controller, and the like.

The non-target control device 11 includes a detection unit and a first high-voltage component 111.

The detection unit includes a controller 131, a current detector 132, and a detection resistor set R11. The controller 131 is connected to the current detector 132. The current detector 132 is connected to the detection resistor set R11. The first high-voltage component 111 is connected to the detection unit.

The current detector 132 in the detection unit of the non-target control device 11 is configured to acquire a voltage signal across the detection resistor set R11, and output a detection result signal according to the voltage signal. The current flowing through the detection resistor set R11 is an alternating current signal, so the acquired voltage signal across the detection resistor set R11 also periodically changes with time. The detection result signal is generated according to the voltage signal. If the high-voltage interlock circuit fails, the voltage signal of the faulty high-voltage interlock circuit may be different from the voltage signal of the normal high-voltage interlock circuit, so that the detection result signal output by the current detector 132 when the high-voltage interlock circuit fails may be different from the detection result signal output by the current detector 132 when the high-voltage interlock circuit is normal. The detection result signal may indicate whether the high-voltage interlock circuit has failed or not, and also indicate the type of the fault.

The controller 131 in the detection unit of the non-target control device 11 may be configured to receive the detection result signal output by the current detector 132 in the detection unit of the non-target control device 11, and determine the fault of the high-voltage interlock circuit based on the detection result signal.

In some examples, the fault of the high-voltage interlock circuit includes the high-voltage interlock circuit being open, the high-voltage interlock circuit being shorted to the ground, or the high-voltage interlock circuit being shorted to the power source.

The target control device 10 includes a detection unit, a current generation controller 14, a current generator 15, and a second high-voltage component 101.

The connection relationship among the components in the detection unit in the target control device 10 is the same as the connection relationship among the components in the detection unit in the non-target control device 11, the functions of the components are basically the same, and thus details are not described herein again.

The controller 131 in the detection unit of the target control device 10 is connected to the current generation controller 14. The current generation controller 14 is connected to the current generator 15. The current generator 15 is connected to the detection resistor set R11 in the detection unit. The second high-voltage component 101 is connected to the current generator 15 and the detection resistor set R11 in the detection unit.

The controller 131 in the detection unit of the target control device 10 may be configured to receive the detection result signal output by the current detector 132 in the detection unit of the target control device 10, and determine the fault of the high-voltage interlock circuit based on the detection result signal. The controller 131 in the detection unit of the target control device 10 may also be used to generate a pulse drive signal for driving the current generation controller 14. By adjusting parameters such as a frequency and a duty ratio of the pulse drive signal, the current generation controller 14 can be controlled to generate voltage signals in different directions at different times, that is, to generate an alternating voltage signal. When the high-voltage interlock system is in a normal operation state, the duty ratio of the pulse drive signal is greater than 0 and less than 100%. In some examples, the pulse drive signal may specifically be a Pulse Width Modulation (PWM) signal.

The current generation controller 14 is configured to generate the alternating voltage signal based on the pulse drive signal. The alternating voltage signal is a voltage signal which has a constant magnitude and a direction changing periodically with time.

The current generator 15 is configured to output the alternating current signal based on the alternating voltage signal. The current generator 15 receives the alternating voltage signal applied to the current generator 15, so as to generate and output the alternating current signal. The alternating current signal is a current signal whose direction changes periodically with time.

By adjusting the parameters such as the frequency and the duty ratio of the pulse drive signal, the parameters such as the frequency and the duty ratio of the alternating voltage signal, the alternating current signal, the voltage signal, and the detection result signal can be adjusted. Therefore, anti-interference of the alternating voltage signal, the alternating current signal, the voltage signal, and the detection result signal can be further improved by adjusting parameters such as the frequency and the duty ratio of the pulse drive signal.

The first high-voltage component 111 and the second high-voltage component 101 are both high-voltage components, and may be same high-voltage components or different high-voltage components. In some examples, the high-voltage component may be a connector, a Manual Service Disconnect (MSD), or the like, which is not limited herein.

The detection resistor set R11 may include one resistor or may include a plurality of resistors. In the case where the detection resistor set R11 includes a plurality of resistors, the number of resistors and the connection relationship are not limited.

In the above embodiments, the current generator 15, the second high-voltage component 101, and the detection resistor set R11 in the target control device 10 together with the detection resistor set R11 and the first high-voltage component 111 in at least one non-target control device 11 form the high-voltage interlock circuit. The above alternating current signal is transmitted in the high-voltage interlock circuit.

It should be noted that the judgment of the fault of the high-voltage interlock circuit by the detection unit of the target control device 10 is the main judgment to determine whether the high-voltage interlock circuit has a fault and determine the type of the fault when the fault occurs. The judgment of the fault of the high-voltage interlock circuit by the detection unit of the non-target control device 11 may be used as an auxiliary judgment or a verification judgment to further ensure the reliability of the determination of the fault of the high-voltage interlock circuit.

In embodiments of the present disclosure, the target control device 10 may generate the alternating current signal such that the alternating current signal is transmitted in the high-voltage interlock circuit. The current detector 132 in the target control device 10 and the current detector 132 in the non-target control device 11 may detect the voltage signal across the detection resistor set R11 through which the alternating current signal flows, and output the detection result signal according to the voltage signal. The controller 131 in the target control device 10 and the controller 131 in the non-target control device 11 can determine the fault of the high-voltage interlock circuit based on the detection result signal. The detection result signal is obtained based on the voltage signal, and the voltage signal is obtained based on the alternating current signal. The alternating current signal is a current signal whose direction changes periodically with time. Therefore, occasional external interferences may not affect a changing trend of the alternating current signal, and thus may not affect a changing trend of the detection result signal. That is to say, with the high-voltage interlock system in the embodiments of the present disclosure, it may be possible to reduce or avoid the interference on the detection result signal due to the external interference, and improve the accuracy of determining the fault of the high-voltage interlock system.

The current generation controller 14, the current generator 15, and the current detector 132 in the above embodiments may be composed of a plurality of components. Specific structures of the current generation controller 14, the current generator 15, and the current detector 132 in the high-voltage interlock system will be described in detail below with reference to various embodiments.

Figure 2:
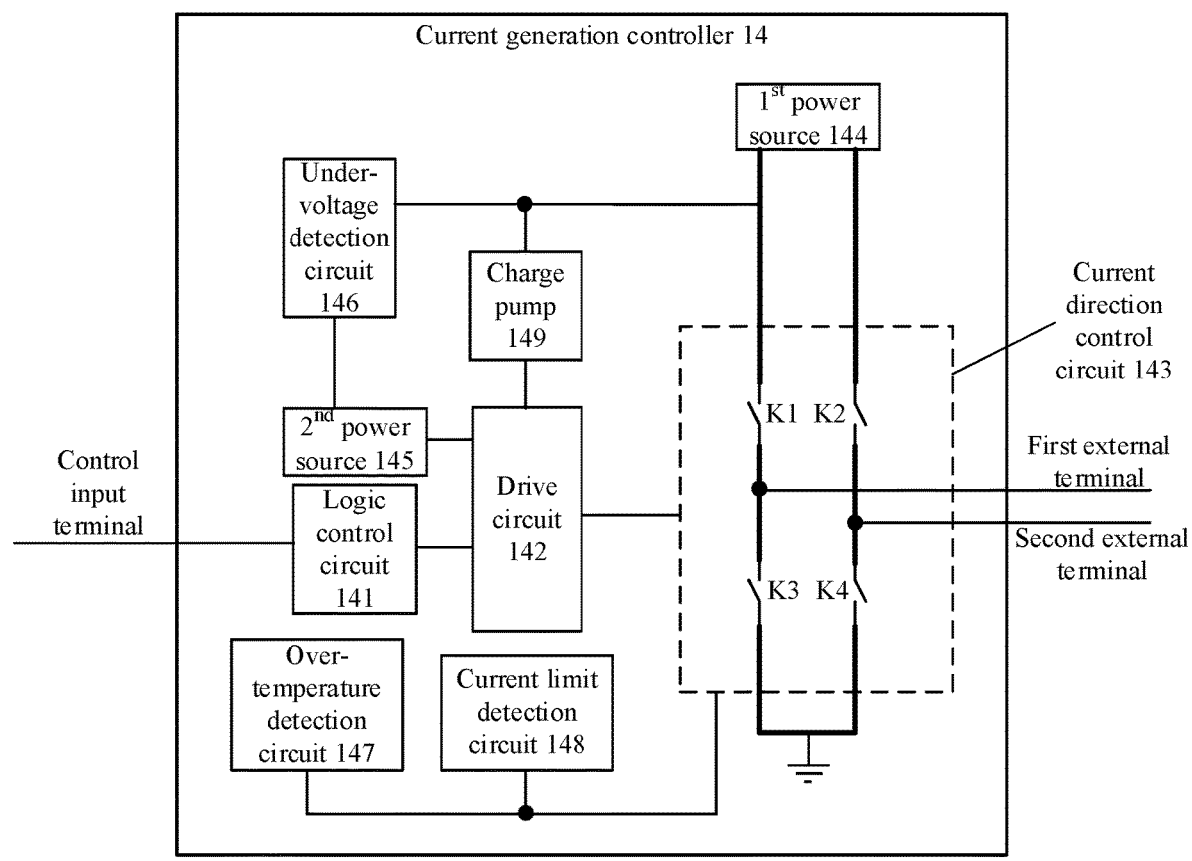
FIG. 2 is a schematic structural diagram of a current generation controller in a high-voltage interlock system according to an embodiment of the present disclosure.

FIG. 2 is a schematic structural diagram of a current generation controller 14 in a high-voltage interlock system according to an embodiment of the present disclosure. As shown in FIG. 2, the current generation controller 14 includes a logic control circuit 141, a drive circuit 142, a current direction control circuit 143, and a first power source 144.

The logic control circuit 141 is connected to the drive circuit 142 and the controller 131 in the target control device 10, and configured to generate a control signal for controlling the drive circuit 142 based on the pulse drive signal.

The logic control circuit 141 has a control input terminal. There may be a number of control input terminals. For example, the control input terminals may include a direction control signal input terminal, a frequency control signal input terminal, an enable signal input terminal, and the like. The specific structure of the logic control circuit 141 is not limited herein. The number and the type of the control input terminals of the logic control circuit 141 are also not limited herein.

In some examples, the pulse drive signal may be a pulse width modulation signal. The logic control circuit 141 receives the pulse drive signal, generates and outputs a control signal by cooperation of various logic components in the logic control circuit 141. This control signal is used to control the drive circuit 142.

The drive circuit 142 is connected to the current direction control circuit 143 and configured to control, based on the control signal, the current direction control circuit 143 to control the direction of the alternating voltage signal. The specific structure of the drive circuit 142 is not limited herein.

The drive circuit 142 receives the control signal, generates and outputs a direction control signal to the current direction control circuit 143 according to the control signal, thereby controlling the current direction control circuit 143 to control the direction of the generated alternating voltage signal.

A positive pole of the first power source 144 is connected to the current direction control circuit 143 and configured to supply power to the current direction control circuit 143. Parameters of the first power source 144 may be set according to specific work scenarios and work requirements, and are not limited herein.

The current direction control circuit 143 is connected to a negative pole of the first power source, and configured to control the alternating voltage signal to periodically change its direction in the current direction control circuit 143 under the control of the drive circuit 142.

In some examples, the current direction control circuit 143 includes a first switch K1, a second switch K2, a third switch K3, a fourth switch K4, a first external terminal, and a second external terminal.

An end of the first switch K1 and an end of the second switch K2 are both connected to the first power source 144. The other end of the first switch K1 is connected to an end of the third switch K3. The other end of the second switch K2 is connected to an end of the fourth switch K4. The other end of the third switch K3 and the other end of the fourth switch K4 are both connected to the ground. Specifically, an end of the first switch K1 and an end of the second switch K2 are both connected to the positive pole of the first power source 144, and the other end of the third switch K3 and the other end of the fourth switch K4 are both connected to the negative pole of the first power source 144. In FIG. 2, the negative pole of the first power source 144 can be regarded to be grounded.

The first external terminal is connected to the other end of the first switch K1 and an end of the third switch K3. The second external terminal is connected to the other end of the second switch K2 and an end of the fourth switch K4.

If the first switch K1 and the second switch K2 are N-type Metal-Oxide-Semiconductors (NMOS), the current generation controller 14 may further include a charge pump 149 that is connected to the drive circuit 142. The charge pump 149 may be used to provide a supplemental voltage signal to the drive circuit 142, so as to enable the drive circuit 142 to continuously keep the first switch K1 and the second switch K2 being turned on. That is, in a scenario where the first switch K1 and the second switch K2 are required to keep being turned on for a period of time, the charge pump 149 can provide the supplemental voltage signal to boost the voltage for driving the first switch K1 and the second switch K2, so that the first switch K1 and the second switch K2 can keep being turned on for the period of time.

For example, as shown in FIG. 2, under the control of the drive circuit 142, the first switch K1 and the fourth switch K4 are turned on, the second switch K2 and the third switch K3 are turned off, and thus the first external terminal is connected to the first power source 144 and the second external terminal is connected to the ground. The direction of the alternating voltage signal is from the first external terminal to the second external terminal.

Under the control of the drive circuit 142, the second switch K2 and the third switch K3 are turned on, the first switch K1 and the fourth switch K4 are turned off, and thus the first external terminal is connected to the ground and the second external terminal is connected to the first power source 144. The direction of the alternating voltage signal is from the second external terminal to the first external terminal.

It is assumed that a first switch combination includes the first switch K1 and the fourth switch K4, and the second switch combination includes the second switch K2 and the third switch K3. Therefore, under the control of the drive circuit 142, the first switch combination and the second switch combination can be alternately turned on, so that the direction of the alternating voltage signal periodically changes.

In some embodiments, as shown in FIG. 2, the current generation controller 14 may further include a second power source 145, an under-voltage detection circuit 146, an over-temperature detection circuit 147, and a current limit detection circuit 148.

The second power source 145 is connected to the drive circuit 142, and configured to provide power to the drive circuit 142. It should be noted that the negative pole of the first power source 144 and the negative pole of the second power source 145 may be set to be grounded.

The under-voltage detection circuit 146 is connected to the first power source 144 and the second power source 145, and configured to detect the voltages of the first power source 144 and the second power source 145. If the voltage of the first power source 144 is lower than an under-voltage threshold or the voltage of the second power source 145 is lower than the under-voltage threshold, the power supply to the drive circuit 142 is stopped so as to stop driving and controlling the current direction control circuit 143.

The over-temperature detection circuit 147 is connected to the current direction control circuit 143. The over-temperature detection circuit 147 detects whether the temperature of the current direction control circuit 143 exceeds an over-temperature threshold. If it is detected that the temperature of the current direction control circuit 143 exceeds the over-temperature threshold, it may be determined that the temperature of the current direction control circuit 143 is too high. An over-temperature feedback signal can be fed back to indicate to stop driving and controlling the current direction control circuit 143.

The current limit detection circuit 148 is connected to the current direction control circuit 143. The current limit detection circuit 148 detects whether the current in the current direction control circuit 143 exceeds a current limit threshold. If it is detected that the current in the current direction control circuit 143 exceeds the current limit threshold, it may be determined that the current in the current direction control circuit 143 is too large. An over-current feedback signal can be fed back to indicate to stop driving the current direction control circuit 143.

Figure 3:
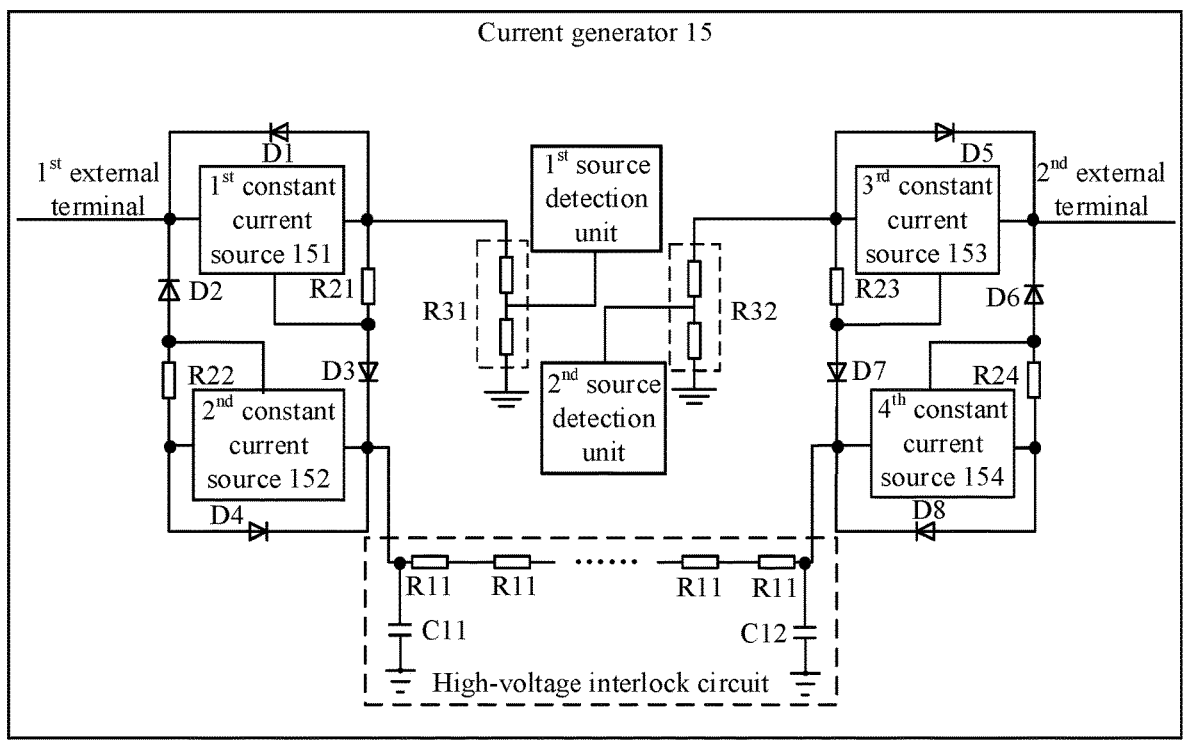
FIG. 3 is a schematic structural diagram of a current generator in a high-voltage interlock system according to an embodiment of the present disclosure.

FIG. 3 is a schematic structural diagram of a current generator 15 in a high-voltage interlock system according to an embodiment of the present disclosure. The first high-voltage component 111 and the second high-voltage component 101 are not shown in FIG. 3. As shown in FIG. 3, the current generator 15 includes a first constant current ("CC") source 151, a second constant current source 152, a third constant current source 153, a fourth constant current source 154, a first current regulating resistor set R21, a second current regulating resistor set R22, a third current regulating resistor set R23, a fourth current regulating resistor set R24, a first diode D1, a second diode D2, a third diode D3, a fourth diode D4, a fifth diode D5, a sixth diode D6, a seventh diode D7, an eighth diode D8, a first voltage dividing resistor set R31, and a second voltage dividing resistor set R32.

By predesigning resistance values of the first current regulating resistor set R21, the second current regulating resistor set R22, the third current regulating resistor set R23, and the fourth current regulating resistor set R24, output currents of the first constant current source 151, the second constant current source 152, the third constant current source 153, and the fourth constant current source 154 can be respectively set.

A first source detection unit may be provided at the first voltage dividing resistor set R31 to detect the first constant current source 151 and the entire current generator 15. For example, the first source detection unit may be connected to a detection terminal of the first voltage dividing resistor set R31. A second source detection unit may be provided at the second voltage dividing resistor set R32 to detect the third constant current source 153 and the entire current generator 15. For example, the second source detection unit may be connected to a detection terminal of the second voltage dividing resistor set R32. As shown in FIG. 3, the first source detection unit connected to the first voltage dividing resistor set R31 can detect whether the first constant current source 151 has failed and whether the entire current generator 15 has failed. The second source detection unit connected to the second voltage dividing resistor set R32 can detect whether the third constant current source 151 has failed and whether the entire current generator 15 has failed.

The first current regulating resistor set R21, the second current regulating resistor set R22, the third current regulating resistor set R23, the fourth current regulating resistor set R24, the first voltage dividing resistor set R31, and the second voltage dividing resistor set R32 may each include one resistor or include a plurality of resistors. In the case where a plurality of resistors are included, the number of resistors and the connection relationship are not limited.

The first constant current source 151, the second constant current source 152, the third constant current source 153, and the fourth constant current source 154 are all constant current sources. The constant current source can feedback and adjust the current so that the output current of the constant current source is a constant current.

A first input terminal of the first constant current source 151 is connected to the current generation controller 14, a cathode of the first diode D1, and a cathode of the second diode D2. Corresponding to FIG. 2, the first input terminal of the first constant current source 151 may be specifically connected to the first external terminal in the current generation controller 14. A second input terminal of the first constant current source 151 is connected to an end of the first current regulating resistor set R21 and an anode of the third diode D3. An output end of the first constant current source 151 is connected to an anode of the first diode D1, the other end of the first current regulating resistor set R21, and an end of the first voltage dividing resistor set R31. The other end of the first voltage dividing resistor set R31 is connected to the ground.

A first input terminal of the second constant current source 152 is connected to a cathode of the third diode D3, a cathode of the fourth diode D4, and an end of the detection resistor set R11 in the target control device 10. A second input terminal of the second constant current source 152 is connected to an anode of the second diode D2 and an end of the second current regulating resistor set R22. An output end of the second constant current source 152 is connected to an anode of the fourth diode D4 and the other end of the second current regulating resistor set R22.

A first input terminal of the third constant current source 153 is connected to the current generation controller 14, a cathode of the fifth diode D5, and a cathode of the sixth diode D6. Corresponding to FIG. 2, the first input terminal of the third constant current source 153 may be specifically connected to the second external terminal in the current generation controller 14. A second input terminal of the third constant current source 153 is connected to an end of the third current regulating resistor set R23 and an anode of the seventh diode D7. An output end of the third constant current source 153 is connected to an anode of the fifth diode D5, the other end of the third current regulating resistor set R23, and an end of the second voltage dividing resistor set R32. The other end of the second voltage dividing resistor set R32 is connected to the ground.

A first input terminal of the fourth constant current source 154 is connected to a cathode of the seventh diode D7, a cathode of the eighth diode D8, and an end of the detection resistor set R11 in the non-target control device. A second input terminal of the fourth constant current source 154 is connected to an anode of the sixth diode D6 and an end of the fourth current regulating resistor set R24. An output end of the fourth constant current source 154 is connected to an anode of the eighth diode D8 and the other end of the fourth current regulating resistor set R24.

With reference to FIG. 2 and FIG. 3, in the case where the direction of the alternating voltage signal is from the first external terminal to the second external terminal, the current flowing out of the first external terminal sequentially passes through the first constant current source 151, the first current regulating resistor set R21, the third diode D3, the plurality of detection resistor sets R11 in the high-voltage interlock circuit, the fourth constant current source 154, the fourth current regulating resistor set R24 and the sixth diode D6, and flows into the second external terminal.

When the direction of the alternating voltage signal is from the second external terminal to the first external terminal, the current flowing out of the second external terminal sequentially passes through the third constant current source 153, the third current regulating resistor set R23, the seventh diode D7, the plurality of detection resistor sets R11 in the high-voltage interlock circuit, the second constant current source 152, the second current regulating resistor set R22 and the second diode D2, and flows into the first external terminal.

The direction of the alternating voltage signal repeatedly changes between from the first external terminal to the second external terminal and from the second external terminal to the first external terminal, thereby realizing transmission of the alternating current signal in the high-voltage interlock circuit.

It should be noted that since the first constant current source 151, the second constant current source 152, the third constant current source 153, and the fourth constant current source 154 are capable of outputting a substantially constant current, the magnitude of the alternating current signal transmitted in the high-voltage interlock circuit is substantially constant. When the number of power supply voltages and the detection resistor sets R11 changes, the magnitude of the alternating current signal transmitted in the high-voltage interlock circuit can still be maintained relatively constant, thereby enhancing the scalability of the high-voltage interlock system. For example, in the case of more and more high-voltage components in new energy vehicles, the data of the non-target control device 11 such as a vehicle controller that needs to be set is also increasing. The high-voltage interlock system in the embodiments of the present disclosure is also applicable to a situation with a large number of high-voltage components. Moreover, in the case where the high-voltage interlock circuit is shorted to the power source or shorted to the ground, since the first constant current source 151, the second constant current source 152, the third constant current source 153, and the fourth constant current source 154 can output substantially constant currents but not generate excessive currents, it is ensured that the various components in the high-voltage interlock system are not burned and the high-voltage interlock system can still work. In this way, the life of the various components in the high-voltage interlock system can be extended.

In some examples, as shown in FIG. 3, the high-voltage interlock system further includes a first capacitor set C11 and a second capacitor set C12.

An end of the first capacitor set C11 is connected to the first input terminal of the second constant current source 152. The other end of the first capacitor set C11 is grounded. An end of the second capacitor set C12 is connected to the first input terminal of the fourth constant current source 154 and the second high-voltage component 101. The other end of the second capacitor set C12 is grounded.

The first capacitor set C11 and the second capacitor set C12 may each include one capacitor or a plurality of capacitors. In the case where a plurality of capacitors are included, the number of capacitors and the manner of connection between the capacitors are not limited. By pre-designing the number of capacitors and the connection relationship between the capacitors in the first capacitor set C11 and the second capacitor set C12, it may be possible to adjust slopes of the alternating current signal in the high-voltage interlock circuit in a rising phase and a falling phase, and also adjust, to some extent, the performance of Electro Magnetic Compatibility (EMC) of the high-voltage interlock system.

Figure 4:
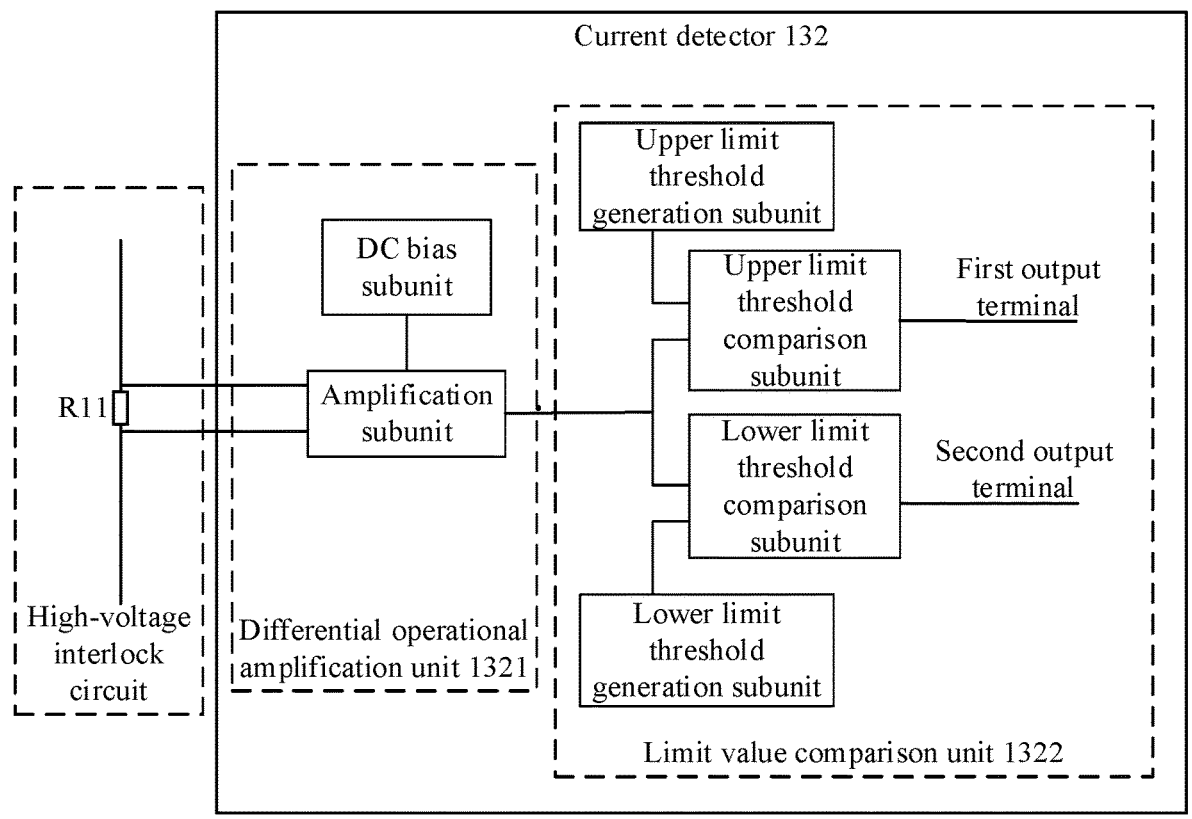
FIG. 4 is a schematic structural diagram of a current detector in a high-voltage interlock system according to an embodiment of the present disclosure.

FIG. 4 is a schematic structural diagram of a current detector 132 in a high-voltage interlock system according to an embodiment of the present disclosure. As shown in FIG. 4, the current detector 132 includes a differential operational amplification unit 1321 and a limit value comparison unit 1322. FIG. 4 does not show the first high-voltage component 111 and the second high-voltage component 101.

Input terminals of the differential operational amplification unit 1321 are connected to both ends of the detection resistor set R11, and an output end of the differential operational amplification unit 1321 is connected to the limit value comparison unit 1322. The differential operational amplification unit 1321 is configured to amplify a voltage signal to a voltage signal to be detected (referred to as a to-be-detected voltage signal hereinafter). The to-be-detected voltage signal is input to the limit value comparison unit 1322.

The limit value comparison unit 1322 is connected to the controller 131, and configured to generate an upper limit signal threshold and a lower limit signal threshold, compare the voltage signal to be detected with the upper limit signal threshold and the lower limit signal threshold, and output a detection result signal. In some examples, the detection result signal may include a plurality of signals. For example, the detection result signal may include a first detection result signal and a second detection result signal.

FIG. 4 also shows specific structures of the differential operational amplification unit 1321 and the limit value comparison unit 1322 of the current detector 132 in the embodiment of the present disclosure. However, the specific structures of the differential operational amplification unit 1321 and the limit value comparison unit 1322 are not limited to those shown in FIG. 4.

As shown in FIG. 4, the differential operational amplification unit 1321 may include a DC bias subunit and an amplification subunit. The DC bias subunit provides a bias voltage for the amplification subunit such that the amplification subunit operates in an amplification state. The amplification subunit is configured to amplify the voltage signal across the detection resistor set R11. In some examples, the DC bias subunit may be implemented by a resistor and a suitable voltage as supplied, and the amplification subunit may be implemented by an amplifier, a resistor, a capacitor, and a suitable voltage as supplied. It should be noted that the DC bias subunit and the amplification subunit may also be implemented by other devices, which are not limited herein.

The limit value comparison unit 1322 may include an upper limit threshold generation subunit, an upper limit threshold comparison subunit, a lower threshold generation subunit, and a lower threshold comparison subunit. The upper limit threshold generation subunit is configured to provide an upper limit signal threshold. The lower limit threshold generation subunit is configured to provide a lower limit signal threshold. The upper limit threshold comparison subunit is configured to compare the to-be-detected voltage signal output by the amplification subunit with the upper limit signal threshold, and output the first detection result signal. The lower threshold comparison subunit is configured to compare the to-be-detected voltage signal output by the amplification subunit and the lower limit signal threshold, and output the second detection result signal.

In some examples, the upper limit threshold generation subunit and the lower limit threshold generation subunit may be implemented by a resistor and a suitable voltage as supplied. The upper limit threshold comparison subunit and the lower limit threshold comparison subunit may be implemented by a comparator. It should be noted that the upper limit threshold generation subunit, the lower limit threshold generation subunit, the upper limit threshold comparison subunit, and the lower threshold comparison subunit may also be implemented by other devices, which are not limited herein.

The to-be-detected voltage signal Vout1 in the case where the direction of the alternating voltage signal is from the first external terminal to the second external terminal is greater than the to-be-detected voltage signal Vout2 in the case where the direction of the alternating voltage signal is from the second external terminal to the first external terminal. When designing the high-voltage interlock system, the to-be-detected voltage signal in the case where the direction of the alternating voltage signal under normal operation of the high-voltage interlock system is from the first external terminal to the second external terminal and the to-be-detected voltage signal in the case where the direction of the alternating voltage signal under normal operation of the high-voltage interlock system is from the second external terminal to the first external terminal are set in different value ranges. In this way, the upper limit signal threshold and the lower limit signal threshold can be used to distinguish between the to-be-detected voltage signal in the case where the direction of the alternating voltage signal is from the first external terminal to the second external terminal and the to-be-detected voltage signal in the case where the direction of the alternating voltage signal is from the second external terminal to the first external terminal. As an example, the to-be-detected voltage signal in the case where the direction of the alternating voltage signal under normal operation of the high-voltage interlock system is from the first external terminal to the second external terminal is set to be higher than the upper limit signal threshold; the to-be-detected voltage signal in the case where the direction of the alternating voltage signal under normal operation of the high-voltage interlock system is from the second external terminal to the first external terminal is set to be lower than the lower limit signal threshold. As another example, the to-be-detected voltage signal in the case where the direction of the alternating voltage signal under normal operation of the high-voltage interlock system is from the first external terminal to the second external terminal is set to be higher than the upper limit signal threshold; the to-be-detected voltage signal in the case where the direction of the alternating voltage signal under normal operation of the high-voltage interlock system is from the second external terminal to the first external terminal is set to be higher than the lower limit signal threshold and lower than the upper limit signal. This is not limited herein.

A specific example will be explained below. For example, the to-be-detected voltage signal in the case where the direction of the alternating voltage signal under normal operation of the high-voltage interlock system is from the first external terminal to the second external terminal is set to be higher than the upper limit signal threshold $V_{lim\_H}$, that is, $V_{out1} > V_{lim\_H}$; the to-be-detected voltage signal in the case where the direction of the alternating voltage signal under normal operation of the high-voltage interlock system is from the second external terminal to the first external terminal is set to be lower than the lower limit signal threshold $V_{lim\_L}$, that is, $V_{out2} < V_{lim\_L}$. When the alternating voltage signal is 0, the to-be-detected voltage signal is higher than the to-be-detected voltage signal when the direction of the alternating voltage signal under normal operation of the high-voltage interlock system is from the second external terminal to the first external terminal. If the to-be-detected voltage signal when the alternating voltage signal is 0 is $V_{out3}$ and $V_{lim\_H} < V_{out3} < V_{lim\_L}$, then in the high-voltage interlock system, there may be four situations in which the high-voltage interlock circuit operates normally, the high-voltage interlock circuit is open, the high-voltage interlock circuit is shorted to the ground, and the high-voltage interlock circuit is shorted to the power source. In the four situations, the first detection result signal output by the first output terminal is different from the second detection result signal output by the second output terminal.

In the current detector 132 shown in FIG. 4, if the to-be-detected voltage signal is higher than or equal to the upper limit signal threshold, the first detection result signal output by the upper limit threshold comparison subunit is a high level signal. If the to-be-detected voltage signal is lower than the upper limit signal threshold, the first detection result signal output by the upper limit threshold comparison subunit is a low level signal. If the to-be-detected voltage signal is higher than or equal to the lower limit signal threshold, the second detection result signal output by the lower limit threshold comparison subunit is a low level signal. If the to-be-detected voltage signal is lower than the lower limit signal threshold, the second detection result signal output by the lower limit threshold comparison subunit is a high level signal.

Figure 5:
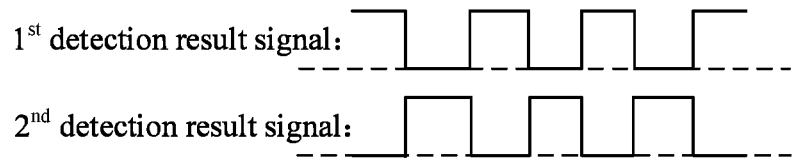
FIG. 5 is a waveform diagram of a first detection result signal and a second detection result signal when a high-voltage interlock circuit normally operates, according to an embodiment of the present disclosure.

FIG. 5 is a waveform diagram of a first detection result signal and a second detection result signal when a high-voltage interlock circuit normally operates according to an embodiment of the present disclosure. As shown in FIG. 5, since the alternating current signal flows through the detection resistor set R11, the to-be-detected voltage signal output from the amplification subunit is also a periodically changing signal. In the case where the direction of the alternating voltage signal is from the first external terminal to the second external terminal, the current flowing through the detection resistor set R11 is n milliamperes. In the case where the direction of the alternating voltage signal is from the second external terminal to the first external terminal, the current flowing through the detection resistor set R11 is –n milliamperes. A state in which the to-be-detected voltage signal is higher than the upper limit signal threshold and a state in which the to-be-detected voltage signal is lower than the lower limit signal threshold alternately appear. Thus the waveforms of the first detection result signal and the second detection result signal as shown in FIG. 5 can be obtained.

Figure 6:
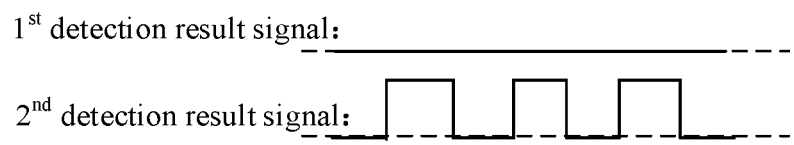
FIG. 6 is a waveform diagram of a first detection result signal and a second detection result signal when a high-voltage interlock circuit is shorted to a power source, according to an embodiment of the present disclosure.

FIG. 6 is a waveform diagram of a first detection result signal and a second detection result signal when a high-voltage interlock circuit is shorted to a power source according to an embodiment of the present disclosure. As shown in FIG. 6, when the second high-voltage component is shorted to the power source and the direction of the alternating voltage signal is from the first external terminal to the second external terminal, the current flowing through the detection resistor set R11 is 0. When the direction of the alternating voltage signal is from the second external terminal to the first external terminal, the current flowing through the detection resistor set R11 is still –n mA in the normal state. Thus, the waveforms of the first detection result signal and the second detection result signal as shown in FIG. 6 are obtained.

Figure 7:
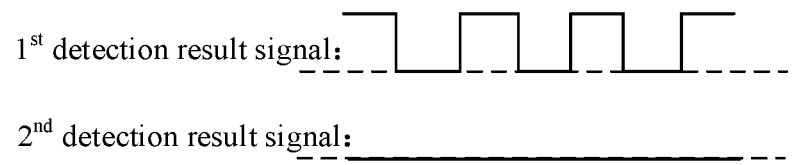
FIG. 7 is a waveform diagram of a first detection result signal and a second detection result signal when a high-voltage interlock circuit is shorted to ground, according to an embodiment of the present disclosure.

FIG. 7 is a waveform diagram of a first detection result signal and a second detection result signal when a high-voltage interlock circuit is shorted to ground according to an embodiment of the present disclosure. As shown in FIG. 7, when the second high-voltage component is shorted to the ground and the direction of the alternating voltage signal is from the second external terminal to the first external terminal, the current flowing through the detection resistor set R11 is 0. When the direction of the alternating voltage signal is from the first external terminal to the second external terminal, the current flowing through the detection resistor set R11 is still n mA in the normal state. Thus, the waveforms of the first detection result signal and the second detection result signal as shown in FIG. 7 are obtained.

Figure 8:
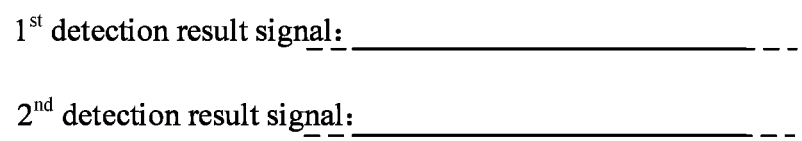
FIG. 8 is a waveform diagram of a first detection result signal and a second detection result signal when a high-voltage interlock circuit is open, according to an embodiment of the present disclosure.

FIG. 8 is a waveform diagram of a first detection result signal and a second detection result signal when a high-voltage interlock circuit is open according to an embodiment of the present disclosure. As shown in FIG. 8, when the second high-voltage component is open and the direction of the alternating voltage signal is from the first external terminal to the second external terminal, the current flowing through the detection resistor set R11 is 0. When the direction of the alternating voltage signal is from the second external terminal to the first external terminal, the current flowing through the detection resistor set R11 is still 0. Thus, the waveforms of the first detection result signal and the second detection result signal as shown in FIG. 8 are obtained.

It should be noted that the dotted line in FIG. 5 to FIG. 8 is a reference line of a low-level signal. The low-level signals coincide with the dotted line, and the high-level signals are higher than the dotted line.

Figure 9:
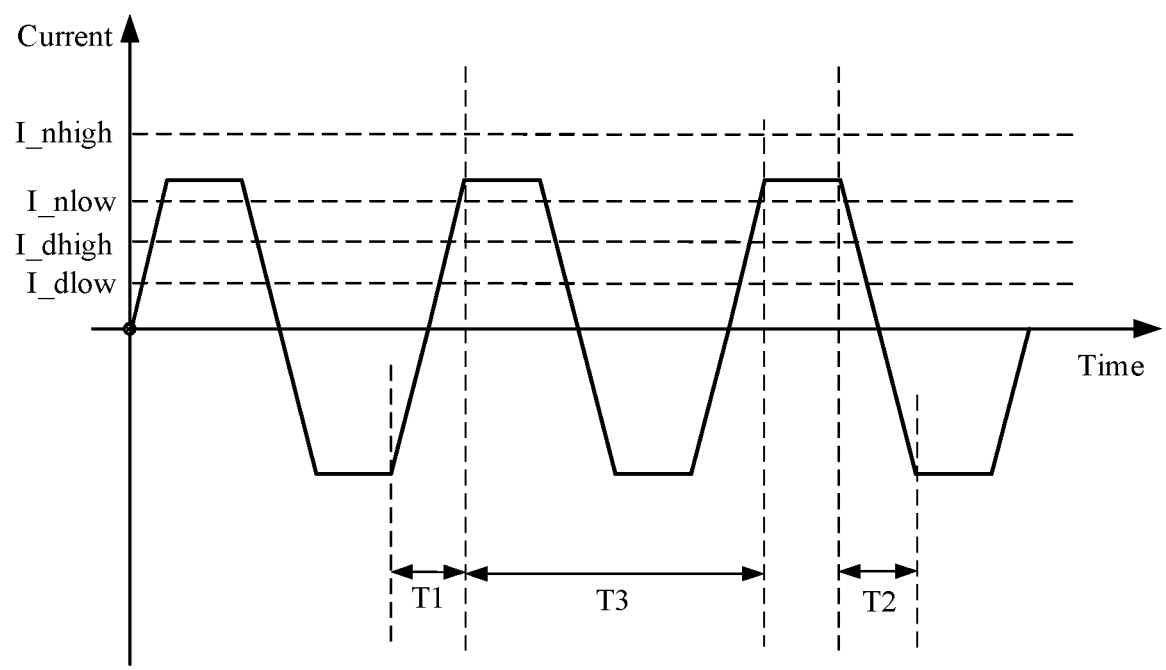
FIG. 9 is a waveform diagram of an alternating current signal produced by a current generator when a high-voltage interlock circuit normally operates, according to an embodiment of the present disclosure.

FIG. 9 is a waveform diagram of an alternating current signal generated by a current generator when a high-voltage interlock system operates normally according to an embodiment of the present disclosure. When the direction of the alternating current signal changes, there may be situations in which the alternating current signal rises and falls. As shown in FIG. 9, the abscissa of the waveform diagram represents the time and the ordinate represents the current. T1 is the rising time of the alternating current signal. T2 is the falling time of the alternating current signal. T3 is a period of the alternating current signal. I_nhigh is the highest limit value of the alternating current signal when the high-voltage interlock system normally operates. I_nlow is the lowest limit value of the alternating current signal when the high-voltage interlock system normally operates. I_dhigh is the highest limit value of the alternating current signal when the high-voltage interlock circuit normally operates to conduct diagnosis. I_dlow is the lowest limit value of the alternating current signal when the high-voltage interlock circuit is disconnected to stop diagnosis.

It should be noted that, in the embodiments of the present disclosure, in the process of determining the fault by using the to-be-detected voltage signal, the upper limit signal threshold, and the lower limit signal threshold, the to-be-detected voltage signal as employed is obtained according to stable portions of the alternating current signal (the portions of the current parallel to the horizontal axis as shown in FIG. 9).

It is worth mentioning that in the non-target control device 11, as in the target control device 10, the determinations about being shorted to the power source, being shorted to the ground, being open, and normal operation can be realized. The determinations about being shorted to the power source, being shorted to the ground, being open, and normal operation and the waveform diagrams when using the non-target control device 11 can be derived by referring to the determinations about being shorted to the power source, being shorted to the ground, being open, and normal operation and the waveform diagrams when using the target control device 10. Detailed description will be no longer given herein.

Figure 10:
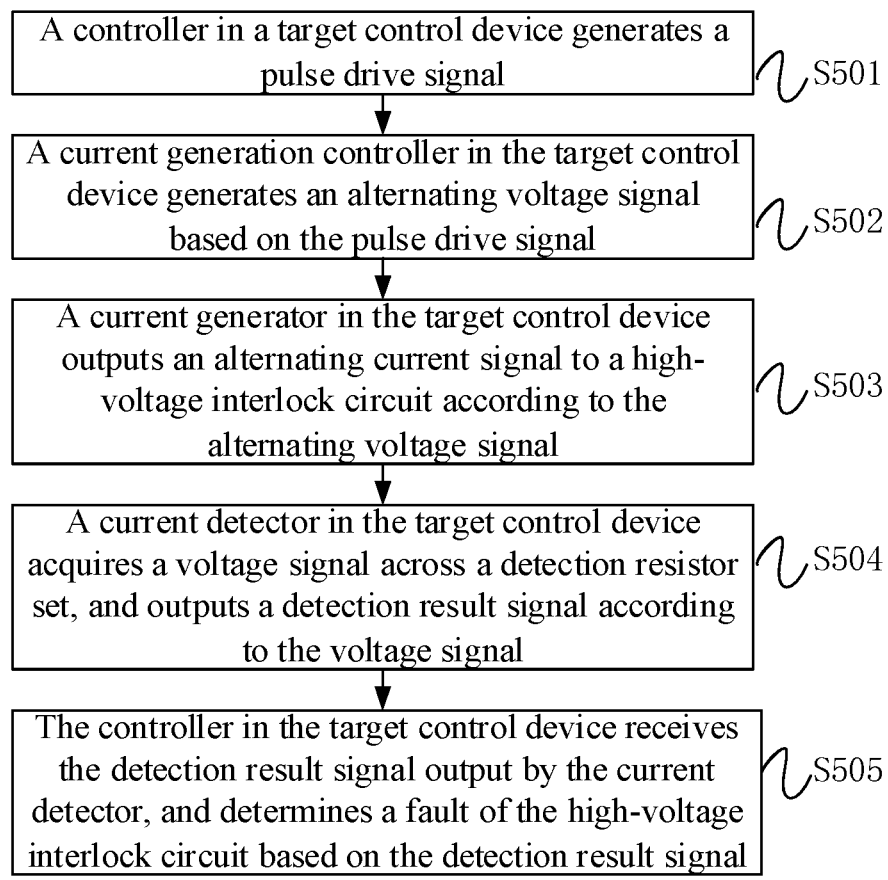
FIG. 10 is a flow chart of a detection method for a high-voltage interlock system according to an embodiment of the present disclosure.

The embodiments of the present disclosure further provide a detection method for a high-voltage interlock system, which can be applied to the high-voltage interlock system in the above embodiments. FIG. 10 is a flowchart of a detection method for a high-voltage interlock system according to an embodiment of the present disclosure. As shown in FIG. 10, the detection method for the high-voltage interlock system may include steps S501 to S505.

In step S501, a controller in a target control device generates a pulse drive signal.

In step S502, a current generation controller in the target control device generates an alternating voltage signal based on the pulse drive signal.

In step S503, a current generator in the target control device outputs an alternating current signal to a high-voltage interlock circuit according to the alternating voltage signal.

In step S504, a current detector in the target control device acquires a voltage signal across a detection resistor set, and outputs a detection result signal according to the voltage signal.

In step S505, the controller in the target control device receives the detection result signal output by the current detector, and determines a fault of the high-voltage interlock circuit based on the detection result signal.

Details about the above steps S501 to S505 may be understood by referring to the related description of the high-voltage interlock system in the above embodiments, and will not be described herein again.

In embodiments of the present disclosure, the target control device may generate the alternating current signal such that the alternating current signal is transmitted in the high-voltage interlock circuit. The current detector in the target control device and the current detector in the non-target control device may detect the voltage signal across the detection resistor set through which the alternating current signal flows, and output the detection result signal according to the voltage signal. The controller in the target control device and the controller in the non-target control device can determine the fault of the high-voltage interlock circuit based on the detection result signal. The detection result signal is obtained based on the voltage signal, and the voltage signal is obtained based on the alternating current signal. The alternating current signal is a current signal whose direction changes periodically with time. Therefore, occasional external interferences may not affect a changing trend of the alternating current signal, and thus may not affect a changing trend of the detection result signal. That is to say, with the high-voltage interlock system in the embodiments of the present disclosure, it may be possible to reduce or avoid the interference on the detection result signal due to the external interference, and improve the accuracy of determining the fault of the high-voltage interlock system.

In some examples, the detection method for the high pressure interlock system may further include an auxiliary detection by a non-target control device. For example, a current detector in the non-target control device acquires the voltage signal across the detection resistor set, and outputs the detection result signal according to the voltage signal. A controller in the non-target control device is configured to receive a detection result signal output by the current detector, and determine a fault of the high-voltage interlock circuit according to the detection result signal.

Details and effects of the auxiliary detection performed by the non-target control device may be understood by referring to the related description of the high-voltage interlock system in the above embodiments, and will not be described herein again.

Corresponding to the structure of the current generation controller shown in FIG. 2, the above step S502 can be refined to include: a logic control circuit in the target control device generates a control signal for controlling a drive circuit according to the pulse drive signal; the drive circuit in the target control device controls a current direction control circuit to control the direction of the alternating voltage signal, according to the control signal; the current direction control circuit in the target control device controls the alternating voltage signal to periodically change its direction in the current direction control circuit, under the control of the drive circuit.

Specifically, the current direction control circuit in the target control device periodically and alternately receives a first direction control signal and a second direction control signal of the drive circuit. The first direction control signal indicates that the first switch and the fourth switch are turned on, and the second switch and the third switch are turned off. The second direction control signal indicates that the second switch and the third switch are turned on, and the first switch and the fourth switch are turned off.

Corresponding to the structure of the current generation controller shown in FIG. 4, the above step S504 can be specifically refined to include: a differential operational amplification unit amplifies the voltage signal into a to-be-detected voltage signal to be input into a limit value comparison unit; the limit value comparison unit generates an upper limit signal threshold and a lower limit signal threshold, compares the to-be-detected voltage signal with the upper limit signal threshold and the lower limit signal threshold, and outputs a detection result signal.

Details and effects of the above-refined steps S502 and S504 may be understood by referring to the related description of the high-voltage interlock system in the above embodiments, and will not be described herein again.

Figure 11:
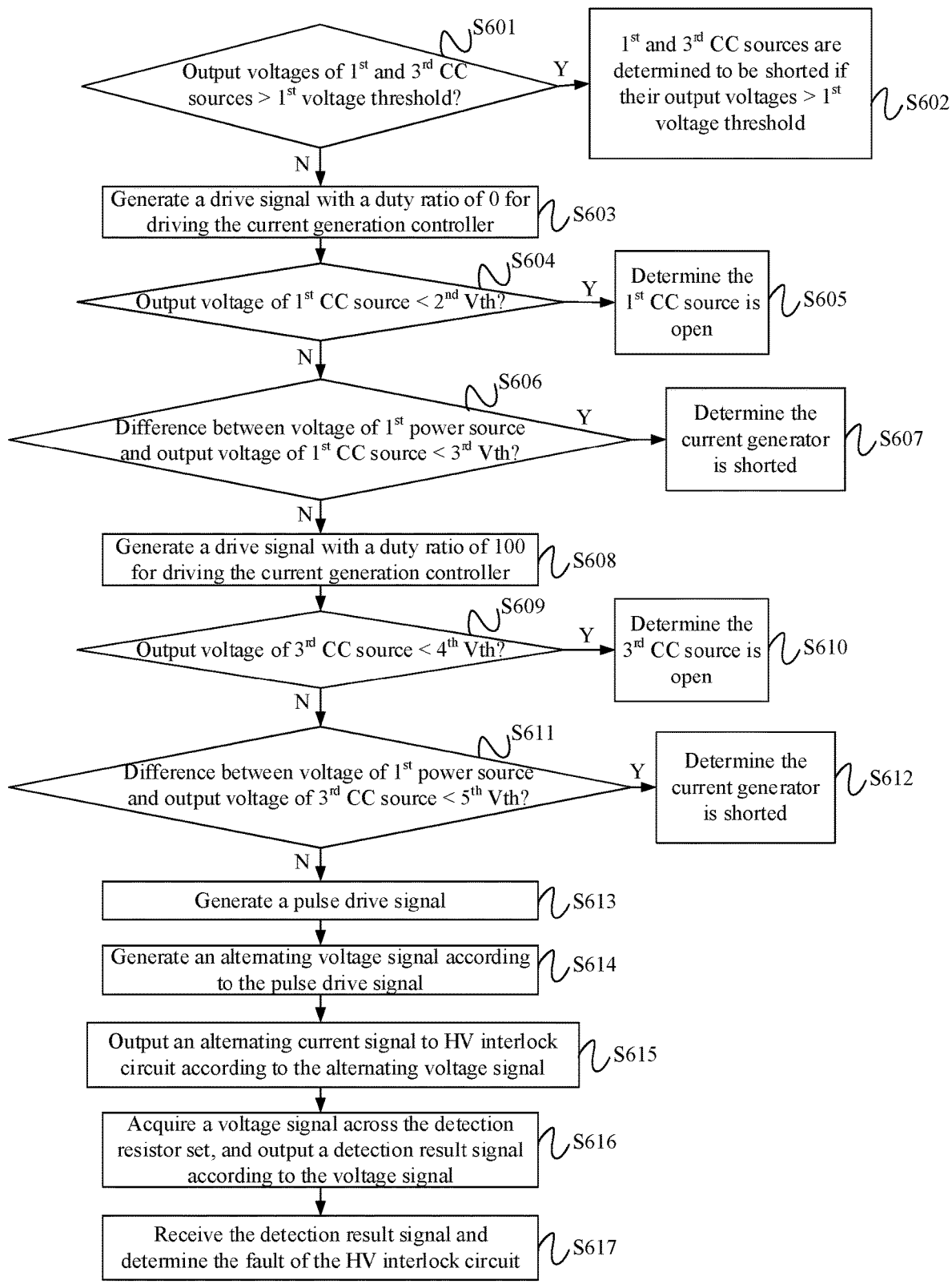
FIG. 11 is a flow chart of a detection method for a high-voltage interlock system according to another embodiment of the present disclosure.

FIG. 11 is a flowchart of a detection method for a high-voltage interlock system according to another embodiment of the present disclosure. Before the controller in the target control device generates the pulse drive signal for driving the current generation controller, some components in the high-voltage interlock system may be detected to detect the fault of the individual components in advance. The detection method for the high-voltage interlock system shown in FIG. 11 may include steps S601 to S617.

In step S601, a first source detection unit and a second source detection unit respectively detect whether an output voltage of a first constant current source and an output voltage of a third constant current source are greater than a first voltage threshold ("Vth").

It should be noted that steps S601 to S603 are performed in a state where the high-voltage interlock system is not yet enabled.

Since the high-voltage interlock system is not yet enabled, the first constant current source and the third constant current source are not yet powered. If the first constant current source is normal, the output voltage of the first constant current source should be close to or equal to zero. Similarly, if the third constant current source is normal, the output voltage of the third constant current source should be close to or equal to zero.

The first voltage threshold may be set according to supply voltages of the first constant current source and the third constant current source and the sampling error, which is not limited herein. For example, the first voltage threshold is 1 volt.

In step S602, if the output voltage of the first constant current source is greater than the first voltage threshold, the first source detection unit determines that the first constant current source is shorted. If the output voltage of the third constant current source is greater than the first voltage threshold, the second source detection unit determines that the third constant current source is shorted.

If the output voltage of the first constant current source is less than or equal to the first voltage threshold, the first source detection unit determines that the first constant current source is normal.

If the output voltage of the third constant current source is less than or equal to the first voltage threshold, the second source detection unit determines that the third constant current source is normal.

In step S603, the controller in the target control device generates a drive signal with a duty ratio of 0 for driving the current generation controller.

In step S604, the first source detection unit detects whether the output voltage of the first constant current source is less than a second voltage threshold.

It should be noted that the drive signal with a duty ratio of 0 causes the current generation controller to generate and output a DC voltage signal. The direction of the DC voltage signal is from a first external terminal to a second external terminal, that is, the current in the current generator is also from the first external terminal to the second external terminal, and passes through the first constant current source. If the first constant current source is open, the output voltage of the first constant current source will be very small. Therefore, whether the first constant current source is open or not can be determined by comparing the output voltage of the first constant current source with the second voltage threshold.

The second voltage threshold may be set according to the supply voltage of the first constant current source and the sampling error, which is not limited herein. For example, the second voltage threshold is 0.5 volts.

In step S605, if the output voltage of the first constant current source is less than the second voltage threshold, the first source detection unit determines that the first constant current source is open.

If the output voltage of the first constant current source is greater than or equal to the second voltage threshold, the first source detection unit determines that the first constant current source is normal.

In step S606, the first source detection unit detects whether the difference between the voltage of the first power source and the output voltage of the first constant current source is less than a third voltage threshold.

It should be noted that the drive signal with a duty ratio of 0 causes the current generation controller to generate and output a DC voltage signal. The direction of the DC voltage signal is from the first external terminal to the second external terminal, that is, the current in the current generator is also from the first external terminal to the second external terminal, and passes through the first constant current source. If the current generator is shorted, the output voltage of the first constant current source will be large and substantially equal to the voltage of the first power source. Therefore, whether the current generator is shorted or not can be determined by comparing the difference between the voltage of the first power source and the output voltage of the first constant current source with the third voltage threshold.

The third voltage threshold may be set according to the supply voltage of the first constant current source, the voltage of the first power source, and the sampling error, which is not limited herein. For example, the third voltage threshold is 0.5 volts.

In step S607, if the difference between the voltage of the first power source and the output voltage of the first constant current source is less than the third voltage threshold, the first source detection unit determines that the current generator is shorted.

If the difference between the voltage of the first power source and the output voltage of the first constant current source is greater than or equal to the third voltage threshold, the first source detection unit determines that the current generator is normal.

In step S608, the controller in the target control device generates a drive signal with a duty ratio of 100% for driving the current generation controller.

In step S609, the second source detection unit detects whether the output voltage of the third constant current source is less than a fourth voltage threshold.

It should be noted that the drive signal with a duty ratio of 100% causes the current generation controller to generate and output a DC voltage signal. The direction of the DC voltage signal is from the second external terminal to the first external terminal, that is, the current in the current generator is also from the second external terminal to the first external terminal, and passes through the third constant current source. If the third constant current source is open, the output voltage of the third constant current source will be small. Therefore, whether the third constant current source is open or not can be determined by comparing the output voltage of the third constant current source with the fourth voltage threshold.

The fourth voltage threshold may be set according to the supply voltage of the third constant current source and the sampling error, which is not limited herein. For example, the fourth voltage threshold is 0.5 volts.

In step S610, if the output voltage of the third constant current source is less than the fourth voltage threshold, the second source detection unit determines that the third constant current source is open.

If the output voltage of the third constant current source is greater than or equal to the fourth voltage threshold, the second source detection unit determines that the third constant current source is normal.

In step S611, the second source detection unit detects whether the difference between the voltage of the first power source and the output voltage of the third constant current source is less than a fifth voltage threshold.

It should be noted that the drive signal with a duty ratio of 100% causes the current generation controller to generate and output a DC voltage signal. The direction of the DC voltage signal is from the second external terminal to the first external terminal, that is, the current in the current generator is also from the second external terminal to the first external terminal, and passes through the third constant current source. If the current generator is shorted, the output voltage of the third constant current source will be large and substantially equal to the voltage of the first power source. Therefore, whether the current generator is shorted or not can be determined by comparing the difference between the voltage of the first power source and the output voltage of the third constant current source with the fifth voltage threshold.

The fifth voltage threshold may be set according to the supply voltage of the third constant current source, the voltage of the first power source, and the sampling error, which is not limited herein. For example, the fifth voltage threshold is 0.5 volts.

In step S612, if the difference between the voltage of the first power source and the output voltage of the third constant current source is less than the fifth voltage threshold, the second source detection unit determines that the current generator is shorted.

If the difference between the voltage of the first power source and the output voltage of the third constant current source is greater than or equal to the fifth voltage threshold, the second source detection unit determines that the current generator is normal.

In step S613, the controller in the target control device generates a pulse drive signal.

It should be noted that the pulse drive signal herein is a pulse signal with a duty ratio greater than 0 and less than 100%.

In step S614, the current generation controller in the target control device generates an alternating voltage signal based on the pulse drive signal.

In step S615, the current generator in the target control device outputs an alternating current signal to the high-voltage interlock circuit according to the alternating voltage signal.

In step S616, the current detector in the target control device acquires the voltage signal across the detection resistor set, and outputs a detection result signal according to the voltage signal.

In step S617, the controller in the target control device receives the detection result signal output by the current detector, and determines the fault of the high-voltage interlock circuit based on the detection result signal.

Steps S613 to S617 are substantially the same as steps S501 to S505 in the above embodiment, and details are not described herein again.

It should be understood that various embodiments in the specification are described in a progressive manner, and the same or similar parts between the various embodiments may be referred to each other, and the description of each embodiment focuses on the difference from other embodiments. For the method embodiments, the relevant points can be found in the description of the system embodiments. The present disclosure is not limited to the specific steps and structures described above and illustrated in the drawings. A person skilled in the art can make various changes, modifications and additions, or change the order between the steps after understanding the spirit of the present disclosure. Also, a detailed description of known method techniques is omitted herein for the sake of conciseness.

The above-described functional blocks shown in the block diagrams may be implemented in hardware, software, firmware, or a combination thereof. When implemented in hardware, they may be, for example, an electronic circuit, an application specific integrated circuit (ASIC), suitable firmware, plug-ins, function cards, and the like. When implemented in software, the elements of the present disclosure may be programs or code segments that are used to perform required tasks. The programs or code segments may be stored in a machine readable medium or transmitted over a transmission medium or communication link via a data signal carried in a carrier. A "machine-readable medium" may include any medium that can store or transfer information. Examples of machine readable media include electronic circuits, semiconductor memory devices, ROM, flash memory, erasable ROM (EROM), floppy disks, CD-ROMs, optical disks, hard disks, fiber optic media, radio frequency (RF) links, and the like. The code segments can be downloaded via a computer network such as the Internet, an intranet, and the like.

What is claimed is:

1. A high-voltage interlock system comprising: a target control device and at least one non-target control device connected in sequence, wherein the non-target control device comprises a detection unit and a first high-voltage component; the detection unit comprises a controller, a current detector, and a detection resistor set; the controller is connected to the current detector, and configured to receive a detection result signal output by the current detector and determine a fault of a high-voltage interlock circuit according to the detection result signal; the current detector is connected to the detection resistor set, and configured to acquire a voltage signal across the detection resistor set and output the detection result signal according to the voltage signal; the first high-voltage component is connected to the detection unit;

the target control device comprises the detection unit, a current generation controller, a current generator, and a second high-voltage component; a controller in the target control device is connected to the current generation controller, and configured to generate a pulse drive signal for driving the current generation controller; the current generation controller is connected to the current generator, and configured to generate an alternating voltage signal according to the pulse drive signal; the current generator is connected to a detection resistor set in the target control device, and configured to output an alternating current signal according to the alternating voltage signal; the second high-voltage component is connected to the current generator and the detection resistor set in the target control device; and the current generator, the second high-voltage component, the detection resistor set in the target control device together with the detection resistor set and the first high-voltage component in the at least one non-target control device form the high-voltage interlock circuit in which the alternating current signal is transmitted;

wherein the current generation controller comprises a logic control circuit, a drive circuit, a current direction control circuit, and a first power source;

the logic control circuit is connected to the drive circuit and the controller in the target control device, and configured to generate a control signal for controlling the drive circuit based on the pulse drive signal;

the drive circuit is connected to the current direction control circuit and configured to control, based on the control signal, the current direction control circuit to control a direction of the alternating voltage signal;

the first power source has a positive pole connected to the current direction control circuit and is configured to supply power to the current direction control circuit; and the current direction control circuit is connected to a negative pole of the first power source, and configured to control the alternating voltage signal to periodically change its direction in the current direction control circuit under the control of the drive circuit.

2. The high-voltage interlock system of claim 1, wherein:
the current direction control circuit comprises a first switch, a second switch, a third switch, a fourth switch, a first external terminal, and a second external terminal;

an end of the first switch and an end of the second switch are both connected to the first power source, the other end of the first switch is connected to an end of the third switch, the other end of the second switch is connected to an end of the fourth switch, and the other end of the third switch and the other end of the fourth switch are both connected to ground; and the first external terminal is connected to the other end of the first switch and the end of the third switch, and the second external terminal is connected to the other end of the second switch and the end of the fourth switch.

3. The high-voltage interlock system of claim 1, wherein the current generator comprises a first constant current source, a second constant current source, a third constant current source, a fourth constant current source, a first current regulating resistor set, a second current regulating resistor set, a third current regulating resistor set, a fourth current regulating resistor set, a first diode, a second diode, a third diode, a fourth diode, a fifth diode, a sixth diode, a seventh diode, an eighth diode, a first voltage dividing resistor set, and a second voltage dividing resistor set;

a first input terminal of the first constant current source is connected to the current generation controller, a cathode of the first diode, and a cathode of the second diode, a second input terminal of the first constant current source is connected to an end of the first current regulating resistor set and an anode of the third diode, an output end of the first constant current source is connected to an anode of the first diode, the other end of the first current regulating resistor set, and an end of the first voltage dividing resistor set, and the other end of the first voltage dividing resistor set is connected to ground;

a first input terminal of the second constant current source is connected to a cathode of the third diode, a cathode of the fourth diode, and an end of the detection resistor set in the target control device, a second input terminal of the second constant current source is connected to an anode of the second diode and an end of the second current regulating resistor set, and an output end of the second constant current source is connected to an anode of the fourth diode and the other end of the second current regulating resistor set;

a first input terminal of the third constant current source is connected to the current generation controller, a cathode of the fifth diode, and a cathode of the sixth diode, a second input terminal of the third constant current source is connected to an end of the third current regulating resistor set and an anode of the seventh diode, an output end of the third constant current source is connected to an anode of the fifth diode, the other end of the third current regulating resistor set, and an end of the second voltage dividing resistor set, and the other end of the second voltage dividing resistor set is connected to the ground; and a first input terminal of the fourth constant current source is connected to a cathode of the seventh diode, a cathode of the eighth diode, and an end of the detection resistor set in the non-target control device, a second input terminal of the fourth constant current source is connected to an anode of the sixth diode and an end of the fourth current regulating resistor set, and an output end of the fourth constant current source is connected to an anode of the eighth diode and the other end of the fourth current regulating resistor set.

4. The high-voltage interlock system of claim 3, further comprising a first source detection unit and a second source detection unit, wherein:

the first source detection unit is connected to a detection terminal of the first voltage dividing resistor set, and configured to detect the first constant current source and the current generator; and the second source detection unit is connected to a detection terminal of the second voltage dividing resistor set, and configured to detect the third constant current source and the current generator.

5. The high-voltage interlock system of claim 3, further comprising a first capacitor set and a second capacitor set, wherein:

an end of the first capacitor set is connected to the first input terminal of the second constant current source, and the other end of the first capacitor set is connected to the ground; and an end of the second capacitor set is connected to the first input terminal of the fourth constant current source and the second high-voltage component, and the other end of the second capacitor set is connected to the ground.

6. The high-voltage interlock system of claim 1, wherein the current detector comprises a differential operational amplification unit and a limit value comparison unit;

the differential operational amplification unit has input terminals connected to both ends of the detection resistor set, and an output end connected to the limit value comparison unit, and is configured to amplify a voltage signal to a to-be-detected voltage signal to be input to the limit value comparison unit; and the limit value comparison unit is connected to the controller, and configured to generate an upper limit signal threshold and a lower limit signal threshold, compare the to-be-detected voltage signal with the upper limit signal threshold and the lower limit signal threshold, and output a detection result signal.

7. The high-voltage interlock system of claim 1, wherein the target control device and at least one non-target control device are any of vehicle control systems.

8. A detection method for a high-voltage interlock system, wherein the detection method is applied to the high-voltage interlock system of claim 1 and comprises:

the controller in the target control device generating the pulse drive signal;

the current generation controller in the target control device generating the alternating voltage signal based on the pulse drive signal;

the current generator in the target control device outputting the alternating current signal to the high-voltage interlock circuit according to the alternating voltage signal;

the current detector in the target control device acquiring the voltage signal across the detection resistor set, and outputting the detection result signal according to the voltage signal; and the controller in the target control device receiving the detection result signal output by the current detector, and determining the fault of the high-voltage interlock circuit based on the detection result signal.

9. The detection method for the high-voltage interlock system of claim 8, further comprising:

the current detector in the non-target control device acquiring the voltage signal across the detection resistor set, and outputting the detection result signal according to the voltage signal; and the controller in the non-target control device receiving the detection result signal output by the current detector, and determining the fault of the high-voltage interlock circuit based on the detection result signal.

10. The detection method for the high-voltage interlock system of claim 8, wherein the current generation controller comprises a logic control circuit, a drive circuit, and a current direction control circuit, the logic control circuit is connected to the drive circuit and the controller in the target control device, the drive circuit is connected to the current direction control circuit, and the current direction control circuit is connected to the ground;

the current generation controller in the target control device generating the alternating voltage signal based on the pulse drive signal comprises:
the logic control circuit in the target control device generating a control signal for controlling the drive circuit according to the pulse drive signal;
the drive circuit in the target control device controlling the current direction control circuit to control the direction of the alternating voltage signal, according to the control signal; and
the current direction control circuit in the target control device controlling the alternating voltage signal to periodically change its direction in the current direction control circuit under the control of the drive circuit.

11. The detection method for the high-voltage interlock system of claim 10, wherein the current direction control circuit comprises a first switch, a second switch, a third switch, a fourth switch, a first external terminal, and a second external terminal; an end of the first switch and an end of the second switch are both connected to the first power source, the other end of the first switch is connected to an end of the third switch, the other end of the second switch is connected to an end of the fourth switch, and the other end of the third switch and the other end of the fourth switch are both connected to ground; the first external terminal is connected to the other end of the first switch and the end of the third switch, and the second external terminal is connected to the other end of the second switch and the end of the fourth switch;

the current direction control circuit in the target control device controlling the alternating voltage signal to periodically change its direction in the current direction control circuit under the control of the drive circuit comprises:
the current direction control circuit in the target control device periodically and alternately receiving a first direction control signal and a second direction control signal of the drive circuit, wherein:
the first direction control signal indicates that the first switch and the fourth switch are turned on, and the second switch and the third switch are turned off; and
the second direction control signal indicates that the second switch and the third switch are turned on, and the first switch and the fourth switch are turned off.

12. The detection method for the high-voltage interlock system of claim 8, wherein the current detector comprises a differential operational amplification unit and a limit value comparison unit, the differential operational amplification unit has input terminals connected to both ends of the detection resistor set and an output end connected to the limit value comparison unit, and the limit value comparison unit is connected to the controller in the target control device;

the current detector acquiring the voltage signal across the detection resistor set and outputting the detection result signal according to the voltage signal comprises:
the differential operational amplification unit amplifying the voltage signal into a to-be-detected voltage signal to be input into the limit value comparison unit;
the limit value comparison unit generating an upper limit signal threshold and a lower limit signal threshold, comparing the to-be-detected voltage signal with the upper limit signal threshold and the lower limit signal threshold, and outputting a detection result signal.

13. The detection method for the high-voltage interlock system of claim 8, wherein the high-voltage interlock system further comprises a first source detection unit and a second source detection unit, the current generator comprises a first constant current source and a third constant current source;

before the current generation controller in the target control device generates the alternating voltage signal according to the pulse drive signal, the detection method for the high-voltage interlock system further comprises:
the first source detection unit and the second source detection unit respectively detecting whether an output voltage of the first constant current source and an output voltage of the third constant current source are greater than a first voltage threshold;
the first source detection unit determining that the first constant current source is shorted if the output voltage of the first constant current source is greater than the first voltage threshold; and
the second source detection unit determining that the third constant current source is shorted if the output voltage of the third constant current source is greater than the first voltage threshold.

14. The detection method for the high-voltage interlock system of claim 8, wherein the high-voltage interlock system further comprises a first source detection unit, the current generation controller comprises a first power source, the current generator includes a first constant current source, and a first input terminal of the first constant current source is connected to the current generation controller;

the detection method for the high-voltage interlock system further comprises:
the controller in the target control device generating a drive signal with a duty ratio of 0 for driving the current generation controller;
the first source detection unit detecting whether an output voltage of the first constant current source is less than a second voltage threshold;
the first source detection unit determining that the first constant current source is open if the output voltage of the first constant current source is less than the second voltage threshold;
the first source detection unit detecting whether a difference between a voltage of the first power source and the output voltage of the first constant current source is less than a third voltage threshold; and
the first source detection unit determining that the current generator is shorted if the difference between the voltage of the first power source and the output voltage of the first constant current source is less than the third voltage threshold.

15. The detection method for the high-voltage interlock system of claim 9, wherein the high-voltage interlock system further comprises a second source detection unit, the current generation controller comprises a first power source, the current generator includes a third constant current source, and an output end of the third constant current source is connected to the current generation controller;

the detection method for the high-voltage interlock system further comprises:
- the controller in the target control device generating a drive signal with a duty ratio of 100% for driving the current generation controller;
- the second source detection unit detecting whether an output voltage of the third constant current source is less than a fourth voltage threshold;
- the second source detection unit determining that the third constant current source is open if the output voltage of the third constant current source is less than the fourth voltage threshold;
- the second source detection unit detecting whether a difference between a voltage of the first power source and the output voltage of the third constant current source is less than a fifth voltage threshold; and
- the second source detection unit determining that the current generator is shorted if the difference between the voltage of the first power source and the output voltage of the third constant current source is less than the fifth voltage threshold.

16. The detection method for the high-voltage interlock system of claim 9, wherein the current detector comprises a differential operational amplification unit and a limit value comparison unit, the differential operational amplification unit has input terminals connected to both ends of the detection resistor set and an output end connected to the limit value comparison unit, and the limit value comparison unit is connected to the controller in the target control device;

the current detector acquiring the voltage signal across the detection resistor set and outputting the detection result signal according to the voltage signal comprises:
- the differential operational amplification unit amplifying the voltage signal into a to-be-detected voltage signal to be input into the limit value comparison unit;
- the limit value comparison unit generating an upper limit signal threshold and a lower limit signal threshold, comparing the to-be-detected voltage signal with the upper limit signal threshold and the lower limit signal threshold, and outputting a detection result signal.

* * * * *